US009159727B2

(12) United States Patent
Park

(10) Patent No.: US 9,159,727 B2
(45) Date of Patent: Oct. 13, 2015

(54) NONVOLATILE MEMORY DEVICE AND METHOD FOR FABRICATING THE SAME

(75) Inventor: Chan-Jin Park, Yongin-si (KR)

(73) Assignee: Samsung Electronics Co., Ltd. (KR)

(*) Notice: Subject to any disclaimer, the term of this patent is extended or adjusted under 35 U.S.C. 154(b) by 245 days.

(21) Appl. No.: 13/537,588

(22) Filed: Jun. 29, 2012

(65) Prior Publication Data

US 2013/0029468 A1 Jan. 31, 2013

(30) Foreign Application Priority Data

Jul. 26, 2011 (KR) ........................ 10-2011-0074228

(51) Int. Cl.
*H01L 21/02* (2006.01)
*H01L 27/10* (2006.01)
*H01L 27/24* (2006.01)
*H01L 45/00* (2006.01)

(52) U.S. Cl.
CPC ............ *H01L 27/101* (2013.01); *H01L 27/249* (2013.01); *H01L 27/2454* (2013.01); *H01L 45/04* (2013.01); *H01L 45/1226* (2013.01); *H01L 45/146* (2013.01)

(58) Field of Classification Search
CPC ... H01L 27/2463; H01L 27/101; H01L 45/04; H01L 45/1226; H01L 45/146; H01L 27/249; H01L 27/2454
USPC ............ 257/E21.676, E21.677, 278, 74, 2, 1; 365/46, 148; 438/382
See application file for complete search history.

(56) References Cited

U.S. PATENT DOCUMENTS

| | | | |
|---|---|---|---|
| 8,415,674 B2* | 4/2013 | Lim et al. ........................ 257/67 |
| 8,427,865 B2* | 4/2013 | Shima et al. ................... 365/163 |
| 8,563,961 B2* | 10/2013 | Sasago et al. ...................... 257/4 |
| 2008/0023765 A1* | 1/2008 | Jeon et al. ...................... 257/350 |
| 2008/0265235 A1* | 10/2008 | Kamigaichi et al. ............... 257/2 |
| 2009/0230458 A1* | 9/2009 | Ishiduki et al. ............... 257/324 |
| 2010/0133606 A1* | 6/2010 | Jang et al. ...................... 257/329 |
| 2011/0149656 A1* | 6/2011 | Tang et al. ............... 365/185.18 |
| 2011/0199813 A1* | 8/2011 | Yoo et al. ....................... 365/148 |
| 2011/0273927 A1* | 11/2011 | Hanzawa et al. ............. 365/163 |
| 2012/0068242 A1* | 3/2012 | Shin et al. ...................... 257/315 |
| 2012/0070944 A1* | 3/2012 | Kim et al. ...................... 438/128 |
| 2012/0120709 A1* | 5/2012 | Mihnea et al. ................. 365/148 |
| 2012/0261638 A1* | 10/2012 | Sills et al. .......................... 257/5 |
| 2013/0203227 A1* | 8/2013 | Huo et al. ...................... 438/238 |

FOREIGN PATENT DOCUMENTS

| | | |
|---|---|---|
| JP | 2008-277543 | 11/2008 |
| KR | 1020100079393 A | 7/2010 |
| KR | 1020110020533 A | 3/2011 |

* cited by examiner

*Primary Examiner* — Latanya N Crawford
(74) *Attorney, Agent, or Firm* — Myers Bigel Sibley & Sajovec, PA

(57) ABSTRACT

Provided are a nonvolatile memory device and a method for fabricating the same. The method includes sequentially stacking on a semiconductor substrate a first interlayer dielectric film, a first sacrificial layer, a second interlayer dielectric film, and a second sacrificial layer, forming a resistance variable layer and a first electrode penetrating the first and second interlayer dielectric films and the first and second sacrificial layers, forming an upper trench by removing a top portion of the first electrode, filling the upper trench with a channel layer, exposing a portion of a side surface of the resistance variable layer by removing the second sacrificial layer, forming an insulation layer within the channel layer, and forming a second electrode on the exposed resistance variable layer.

15 Claims, 21 Drawing Sheets

NONVOLATILE MEMORY DEVICE AND METHOD FOR FABRICATING THE SAME

CROSS-REFERENCE TO RELATED APPLICATION

This application claims priority from Korean Patent Application No. 10-2011-0074228 filed on Jul. 26, 2011 in the Korean Intellectual Property Office, and all the benefits accruing therefrom under 35 U.S.C. 119, the contents of which in its entirety are herein incorporated by reference.

BACKGROUND

1. Field of the Invention

The present invention relates to a nonvolatile memory device and a method for fabricating the same.

2. Description of the Related Art

A semiconductor memory device is a storage device implemented using a semiconductor material, such as silicon (Si), germanium (Ge), gallium arsenide (GaAs), or indium phosphide (InP). Semiconductor memory devices are largely divided into volatile memory devices and nonvolatile memory devices.

A volatile memory device is a memory device that can lose stored data when power is cut off. Volatile memory devices include a static RAM (SRAM), a dynamic RAM (DRAM), and a synchronous DRAM (SDRAM).

A nonvolatile memory device is a memory device that retains stored data even when the supply of power is cut off. A nonvolatile memory device includes a read only memory (ROM), programmable ROM (PROM), electrically programmable ROM (EPROM), electrically erasable and programmable ROM (EEPROM), a flash memory device, a resistive memory device (for example, phase-change RAM (PRAM), ferroelectric RAM (FRAM), or resistive RAM (RRAM) etc.).

SUMMARY

As semiconductor devices become more highly integrated in recent years, active studies have been made on vertically stacked nonvolatile memory devices to improve the level of integration. To drive the vertically stacked nonvolatile memory device, there is demand for transistors for controlling a memory cell in a predetermined unit (for example, in units of pages or sections). However, in view of the configuration of a vertical stack type nonvolatile memory device, it may not be easy to form the transistor in a device while reliably connecting wiring and the transistor. Thus, studies of the vertical stack type nonvolatile memory device are being continuously conducted to overcome the problem.

The present invention, according to some embodiments, provides a method for fabricating a nonvolatile memory device including transistors that control memory cells in a predetermined unit.

The present invention, according to some embodiments, also provides a nonvolatile memory device including transistors that control memory cells in a predetermined unit.

According to an aspect of the present invention, there is provided a method for fabricating a nonvolatile memory device, the method including sequentially stacking on a semiconductor substrate a first interlayer dielectric film, a first sacrificial layer, a second interlayer dielectric film, and a second sacrificial layer, forming a resistance variable layer and a first electrode penetrating the first and second interlayer dielectric films and the first and second sacrificial layers, forming an upper trench by removing a top portion of the first electrode, filling the upper trench with a channel layer, exposing a portion of a side surface of the resistance variable layer by removing the second sacrificial layer, forming an insulation layer within the channel layer, and forming a second electrode on the exposed resistance variable layer.

According to another aspect of the present invention, there is provided a method for fabricating a nonvolatile memory device, the method including sequentially stacking on a semiconductor substrate a first interlayer dielectric film, a first s sacrificial layer, a second interlayer dielectric film, and a second sacrificial layer, forming a first electrode penetrating the first and second interlayer dielectric films and the first and second sacrificial layers, forming an upper trench by removing a top portion of the first electrode, filling the upper trench with a channel layer, exposing a portion of a side surface of the channel layer by removing the second sacrificial layer, forming an insulation layer within the side surface of the exposed channel layer, forming a resistance variable layer along a top surface of the second interlayer dielectric film and a side surface of the exposed channel layer, and forming a second electrode on the resistance variable layer.

According to still another aspect of the present invention, there is provided a nonvolatile memory device including first to third interlayer dielectric films sequentially stacked on a semiconductor substrate to be spaced apart, a first electrode formed between the first interlayer dielectric film and the second interlayer dielectric film, a second electrode formed between the second interlayer dielectric film and the third interlayer dielectric film, a third electrode formed to penetrate the first electrode, a resistance variable layer formed to penetrate the first and second electrodes, and a channel layer penetrating the second electrode and formed on the third electrode, wherein an insulation layer formed within a channel layer adjacent to the second electrode.

According to a further aspect of the present invention, there is provided a nonvolatile memory device including first to third interlayer dielectric films sequentially stacked on a semiconductor substrate to be spaced apart, a first electrode formed between the first interlayer dielectric film and the second interlayer dielectric film, a second electrode formed between the second interlayer dielectric film and the third interlayer dielectric film, a third electrode formed to penetrate the first electrode, a channel layer penetrating the second electrode and formed on the third electrode, a first resistance variable layer formed along a top surface of the first interlayer dielectric film, a side surface of the third electrode and a bottom surface of the second interlayer dielectric film, and a second resistance variable layer formed to surround the second electrode along a top surface of the second interlayer dielectric film, a side surface of the channel layer and a bottom surface of the third interlayer dielectric film, wherein an insulation layer making a contact with the second electrode is formed within the channel layer.

BRIEF DESCRIPTION OF THE DRAWINGS

The above and other features and advantages of the present invention will become more apparent by describing in detail embodiments thereof with reference to the attached drawings in which.

DETAILED DESCRIPTION OF THE EMBODIMENTS

The present invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Hereinafter, a nonvolatile memory device according to an embodiment of the present invention will be described with reference to FIGS. 1 to 5.

Figure 1:
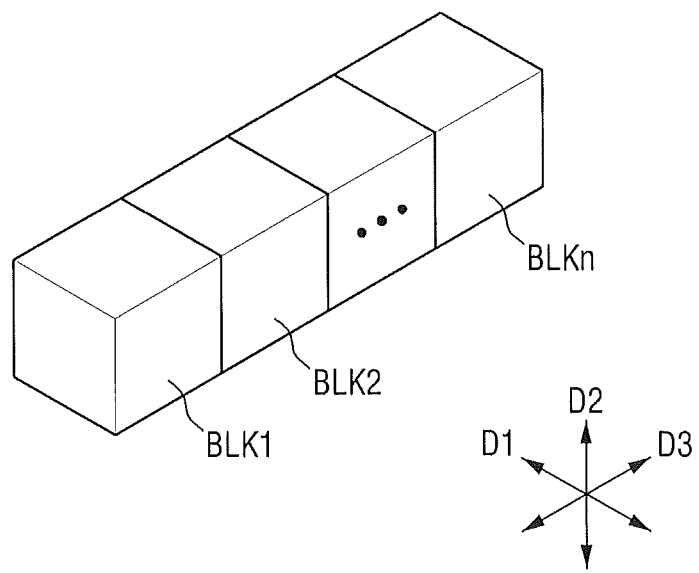
FIG. 1 is a conceptual diagram illustrating a nonvolatile memory device according to an embodiment of the present invention.
Figure 2:
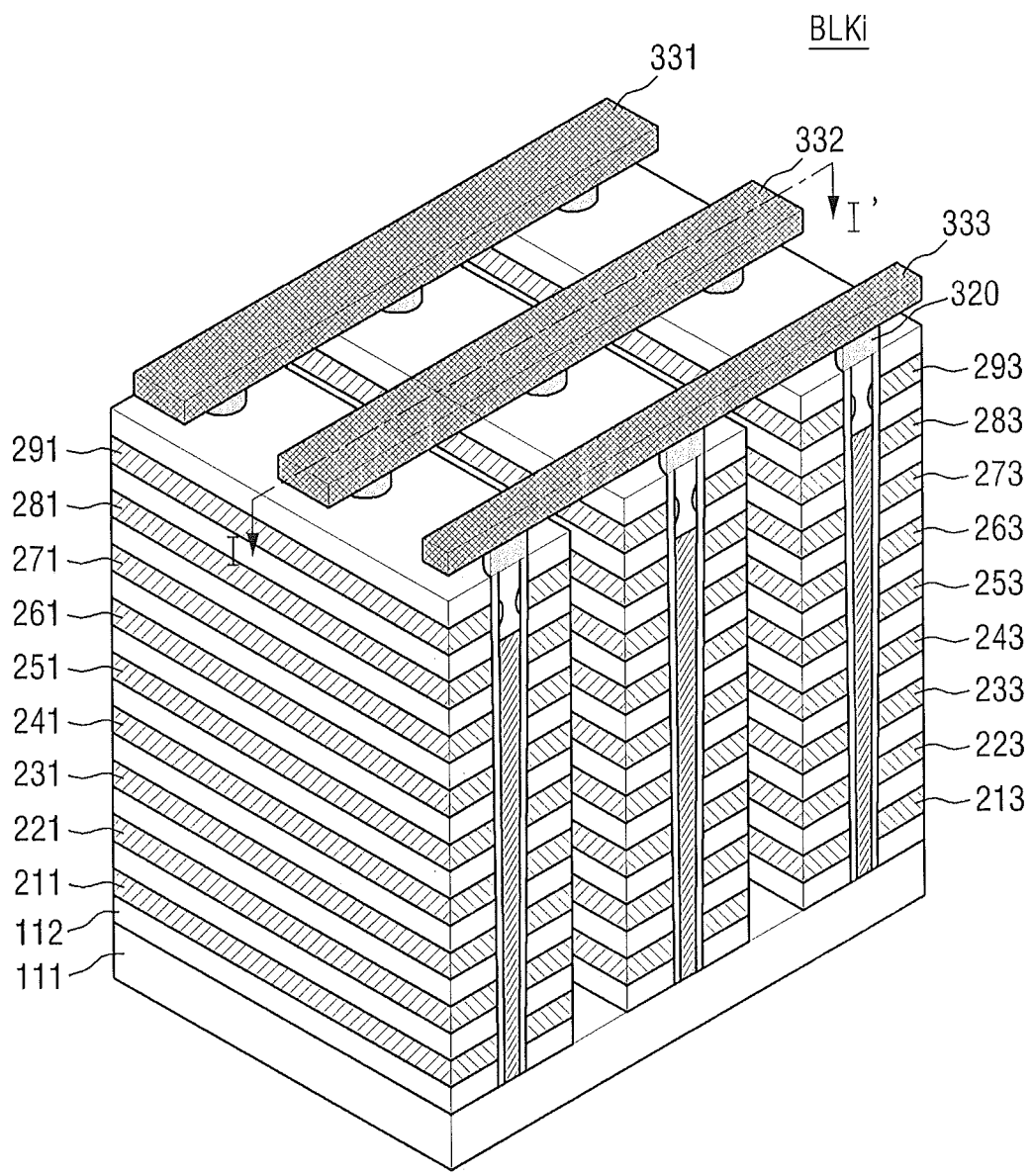
FIG. 2 is a perspective view of a memory block shown in FIG. 1.
Figure 2:
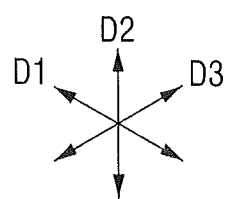
Figure 3:
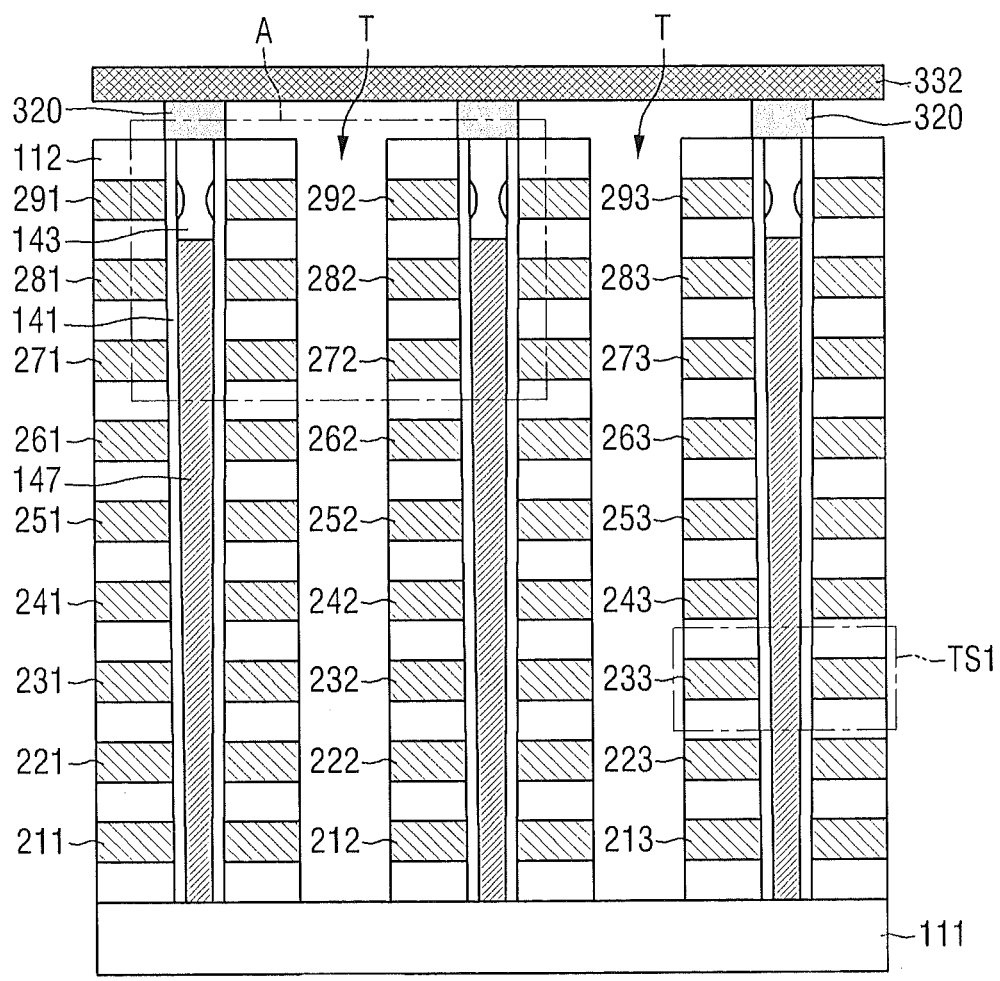
FIG. 3 is a sectional view taken along the line I-I' of FIG. 2.
Figure 4:
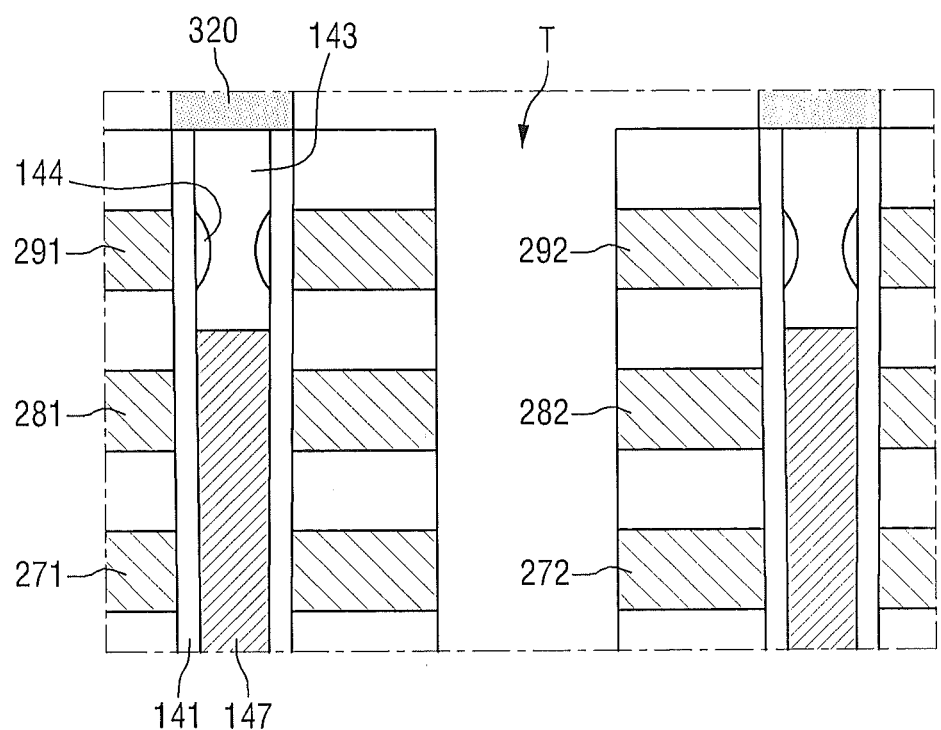
FIG. 4 is an enlarged view illustrating an 'A' region of FIG. 3.
Figure 5:
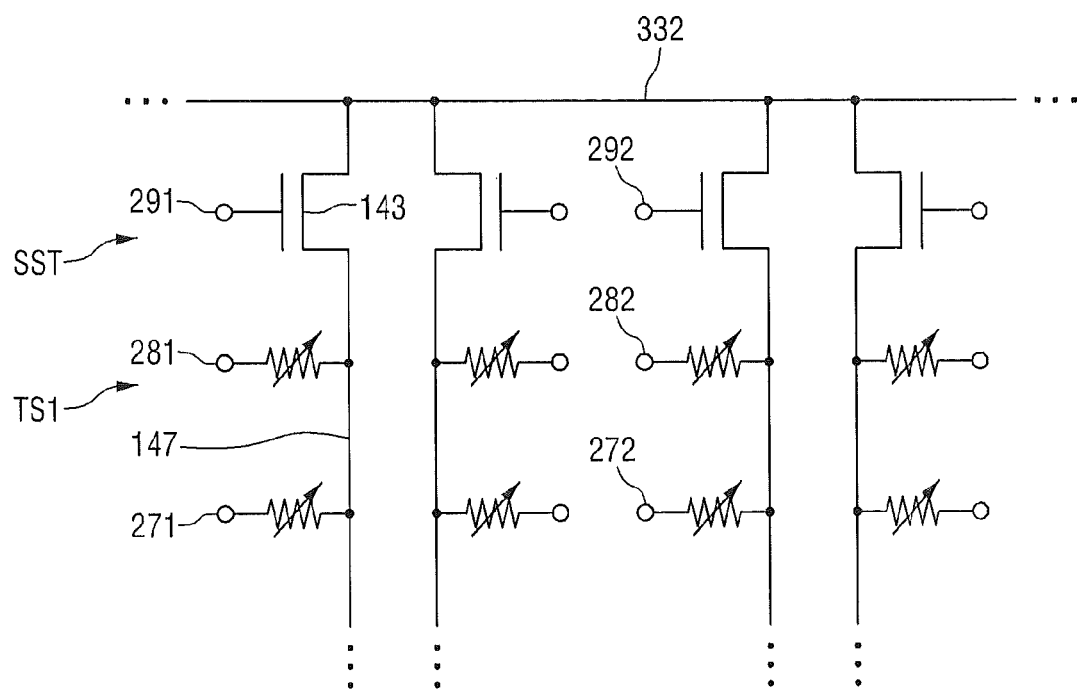
FIG. 5 is a circuit diagram of a transistor shown in FIG. 4.

FIG. 1 is a conceptual diagram illustrating a nonvolatile memory device according to an embodiment of the present invention, FIG. 2 is a perspective view of a memory block shown in FIG. 1, FIG. 3 is a sectional view taken along the line I-I' of FIG. 2, FIG. 4 is an enlarged view illustrating an 'A' region of FIG. 3, and FIG. 5 is a circuit diagram of a transistor shown in FIG. 4.

Through this specification, the nonvolatile memory device will be described with reference to resistive random access memory (RRAM) that stores data using a resistance change of a resistance variable layer by way of example, but embodiments of the invention are not limited thereto.

Referring to FIG. 1, a memory cell array of a nonvolatile memory device 1 according to an embodiment of the present invention may include a plurality of memory blocks BLK1-BLKn (n is a natural number.). The respective memory blocks BLK1-BLKn may extend in first to third directions D1, D2 and D3. As shown in FIG. 1, the first to third directions D1, D2 and D3 may cross each other and are different from one another. For example, the first to third directions D1, D2 and D3 may cross one another at right angles, but are not limited thereto.

Referring to FIGS. 2 to 4, memory blocks BLKi, where 1≤i≤n and 1 is a natural number, may include a plurality of interlayer dielectric films 112, a plurality of first electrodes 147, a plurality of second electrodes 211-291, 212-292 and 213-293, and a plurality of resistance variable layers 141 formed on the semiconductor substrate 111.

The plurality of interlayer dielectric films 112 may be sequentially stacked on the semiconductor substrate 111 to be spaced apart from each other in a second direction D2. As shown in FIG. 2, the plurality of interlayer dielectric films 112 may extend in a first direction D1

The plurality of first electrodes 147 may extend in a second direction D2. In detail, the plurality of first electrodes 147 may be disposed in a pillar type on the semiconductor substrate 111 to penetrate the plurality of interlayer dielectric films 112 and the plurality of second electrodes 211-281, 212-282 and 213-283.

The plurality of first electrodes 147 arranged in the third direction D3 may be electrically connected to each other by bit lines 331-333. That is to say, the plurality of first electrodes 147 arranged in the third direction D3 may share the bit lines 331 to 333.

As shown in FIGS. 2 and 3, the plurality of first electrodes 147 may be arranged in the first direction D1 and the third direction D3 so as to be spaced apart from each other. That is to say, the plurality of first electrodes 147 may be arranged in a matrix type configuration. In FIGS. 2 and 3, the plurality of first electrodes 147 are arranged in a 3×3 matrix type configuration, but embodiments of the invention are not limited thereto.

A channel layer 143 may be formed on the plurality of first electrodes 147. In detail, the channel layer 143 may be formed between the plurality of first electrodes 147 and the bit line contact 320 while making contact with both of the plurality of first electrodes 147 and the bit line contact 320.

A top surface of the channel layer 143 may be higher than top surfaces of the second electrodes 281, 282 and 283. In addition, the top surface of the channel layer 143 may be lower than bottom surfaces of the second electrodes 291, 292 and 293.

While the top surface of the channel layer 143 is higher than top surfaces of the second electrodes 281, 282 and 283 and lower than the bottom surfaces of the second electrodes 291, 292 and 293 in the illustrated embodiment, embodiments of the present invention are not limited thereto. However, the top surface of the channel layer 143 may be higher than top surfaces of the second electrodes 271, 272 and 273. In addition, the top surface of the channel layer 143 may be lower than bottom surfaces of the second electrodes 281, 282 and 283.

The channel layer 143 may be, for example, a polysilicon (poly-Si) layer. In detail, the channel layer 143 may be, for example, a layer formed by performing laser annealing or thermal annealing on a poly-Si layer to adjust layer characteristics according to the necessity. In addition, the channel layer 143 may be, for example, a layer formed by doping a first conductivity type (N type) impurity or a second conductivity type (P type) impurity into a poly-Si layer to adjust layer characteristics according to the necessity.

An insulation layer 144 may be formed in the channel layer 143 adjacent to the plurality of second electrodes 291, 292 and 293. The insulation layer 144 may be, for example, an oxide layer. In detail, the insulation layer 144 may be an oxide layer formed by thermally oxidizing the channel layer 143. In greater detail, insulation layer 144 may be a silicon oxide ($SiO_2$) layer formed by thermally oxidizing a poly-Si channel layer 143.

An isolation trench T may be formed in the plurality of interlayer dielectric films 112 between the plurality of first electrodes 147 arranged in the third direction D3. Side surfaces of the plurality of second electrodes 211-291, 212-292 and 213-293 exposed by the isolation trench T and side surfaces of the plurality of interlayer dielectric films 112 may be aligned with each other.

At least one of the plurality of first and second electrodes 147, 211-291, 212-292 and 213-293 may be formed of a metal. The plurality of first electrodes 147 may be formed of, e.g., Ru, RuOx, Ti/TiN, Zr/TiN, NiSix, TiN, Wn, W, Al, Cu, or alloys thereof, but embodiments of the present invention are not limited thereto. In addition, the plurality of second electrodes 211-291, 212-292 and 213-293 may be formed of, e.g., Ti/TiN, Ta/TiN, W, Pt, Pd, Rh, Ru, Ir, or alloys thereof, but embodiments of the present invention are not limited thereto.

Although not shown, at least one of the plurality of first electrodes 147 and at least one of the second electrodes 211-291, 212-292 and 213-293 may have a double layered structure of a conductive layer (not shown) and a diffusion preventing layer (not shown). In detail, at least one of the plurality of first electrodes 147 and at least one of the second electrodes 211-291, 212-292 and 213-293 may have a double layered structure of a conductive layer (not shown) made of a conductive material and a diffusion preventing layer (not shown) for preventing diffusion of the conductive material.

Resistance variable layers 141 may be disposed between each of the plurality of first electrodes 147 and each of the plurality of second electrodes 211-291, 212-292 and 213-293. The resistance variable layers 141 may be formed along the side surfaces of the plurality of first electrodes 147 in parallel with the plurality of first electrodes 147 in the second direction D2.

The resistance variable layers 141 may be formed of, e.g., a transition metal oxide (TMO). In detail, the TMO may include, but not limited to, HfOx, TiOx, TaOx, ZnO, $Ti_2O$, $Nb_2O_5$, $ZrO_2$, and NiO. While the illustrated embodiment shows that the resistance variable layers 141 have a single layered structure, they may have a multi-layered structure such as a double layered structure or a triple layered structure, when necessary. In addition, a second sacrificial layer (not shown) made of, e.g., $SiO_2$, may further be formed between the resistance variable layers 141 and the plurality of interlayer dielectric films 112, or between the resistance variable layers 141 and the plurality of second electrodes 211-291, 212-292 and 213-293, when necessary.

Nonvolatile memory cells TS1 may be defined at regions where the first electrodes 147 and the second electrodes 211-281, 212-282 and 213-283 intersect. In addition, transistors capable of controlling the nonvolatile memory cells positioned under the transistors may be defined at regions where the channel layer 143 and the second electrodes 291, 292 and 293 intersect. Here, the transistors may be, for example, section selection transistors (SSTs) for controlling a data voltage applied from a bit line 332 to be applied to the nonvolatile memory cells positioned under the section selection transistors (SSTs), but not limited thereto.

In detail, referring to FIGS. 4 and 5, the channel layer 143 may serve as a body of the transistor SST, and the second electrodes 291, 292 and 293 contacting the channel layer 143 may serve as gate electrodes of the transistors SSTs. In addition, the insulation layer 144 formed on a contact surface between the channel layer 143 and the second electrodes 291, 292 and 293 may serve as gate insulation layers of the transistors SST.

Here, it is assumed that a predetermined data voltage is applied to the bit line 332. First, if a voltage higher than a threshold voltage is applied to the second electrodes 291, 292 and 293, a channel may be formed in the channel layer 143. Accordingly, the predetermined data voltage applied to the bit line 332 is transferred to the first electrodes 147 and is then transferred to the lower nonvolatile memory cells TS1 sharing the first electrodes 147.

Conversely, if a voltage lower than the threshold voltage is applied to the second electrodes 291, 292 and 293, a channel may not be formed in the channel layer 143. Accordingly, the predetermined data voltage applied to the bit line 332 is not transferred to the first electrodes 147. Thus, the predetermined data voltage is not transferred to the lower nonvolatile memory cells TS1 sharing the first electrodes 147.

In summary, the channel layer 143, the second electrodes 291, 292 and 293 and the insulation layer 144 may serve as the transistors SST for controlling the predetermined data voltage applied to the bit line 332 to be applied to the lower nonvolatile memory cells TS1. That is to say, the nonvolatile memory device 1 according to an embodiment of the present invention having a vertically stacked structure may include the transistors SST for controlling the lower nonvolatile memory cells TS1 in a predetermined unit (for example, in units of pages or sections) while being connected to wirings (e.g., bit line 332) and the first electrodes 147 in a reliable manner.

The nonvolatile memory device 1 according to the embodiment of the present invention may be fabricated in various embodiments. As an example, a method for fabricating a nonvolatile memory device according to an embodiment of the present invention will be described with reference to FIGS. 6 to 13.

FIGS. 6 to 13 illustrate interim steps of a method for fabricating a nonvolatile memory device according to an embodiment of the present invention.

Figure 6:
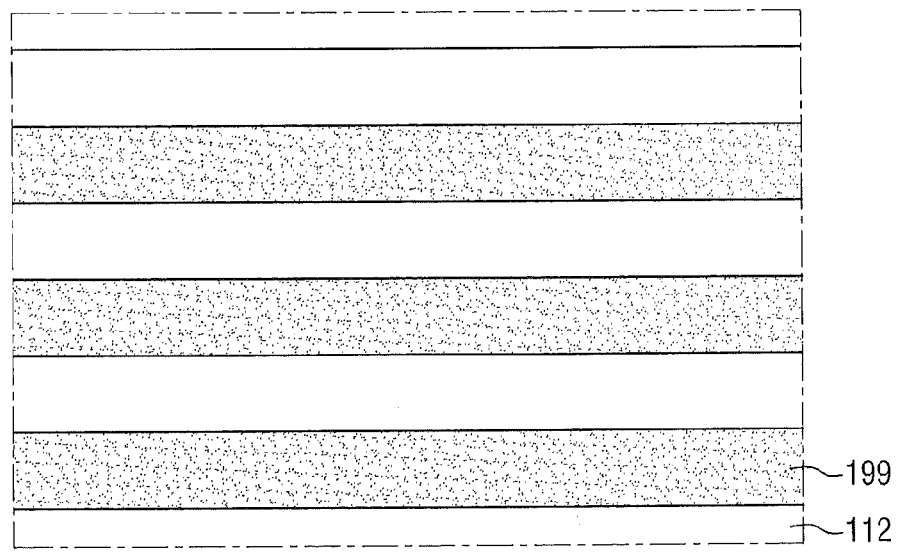
FIGS. 6 to 13 illustrate interim steps of a method for fabricating a nonvolatile memory device according to an embodiment of the present invention.

Referring first to FIG. 6, multi-layered interlayer dielectric films 112 and a multi-layered first sacrificial layer 199 are alternately stacked on the semiconductor substrate (111 of FIG. 3). Here, the first sacrificial layer 199 and interlayer dielectric films 112 may be formed of materials having different etch rates. For example, the first sacrificial layer 199 may be a nitride layer, and the interlayer dielectric films 112 may be an oxide layer.

Figure 7:
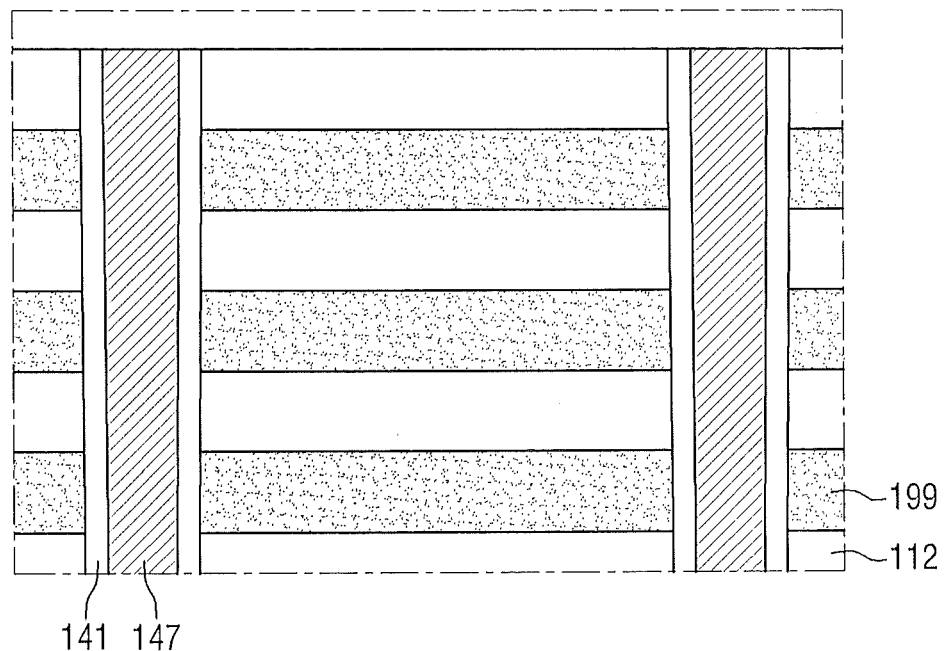

Next, referring to FIG. 7, resistance variable layers 141 and first electrodes 147 are formed to penetrate the multi-layered interlayer dielectric films 112 and the multi-layered first sacrificial layer 199. In detail, first, the multi-layered interlayer dielectric films 112 and the multi-layered first sacrificial layer 199 are etched to form penetration holes. Then, the penetration holes are filled with the resistance variable layers 141 and the first electrodes 147. Here, the resistance variable layers 141 are formed along inner walls of the penetration holes by, for example, chemical vapor deposition (CVD), physical vapor deposition (PVD) or atomic layer deposition (ALD). Remaining spaces of the penetration holes are filled by a conductive material and planarized to form the first electrodes 147.

A second sacrificial layer (not shown) made of, e.g., $SiO_2$, may further be formed between the interlayer dielectric films 112 or the first sacrificial layer 199 and the resistance variable layers 141, when necessary.

The resistance variable layers 141 may be formed of, e.g., a transition metal oxide (TMO). In detail, the TMO may include, but is not limited to, HfOx, TiOx, TaOx, ZnO, $Ti_2O$, $Nb_2O_5$, $ZrO_2$, and NiO. The first electrode 143 may be formed of a metal, e.g., Ru, RuOx, Ti/TiN, Zr/TiN, NiSix, TiN, Wn, W, Al, Cu, or alloys thereof, but is not limited thereto. In addition, although not shown, the first electrode 147 may have a double layered structure of a conductive layer (not shown) and a diffusion preventing layer (not shown).

Figure 8:
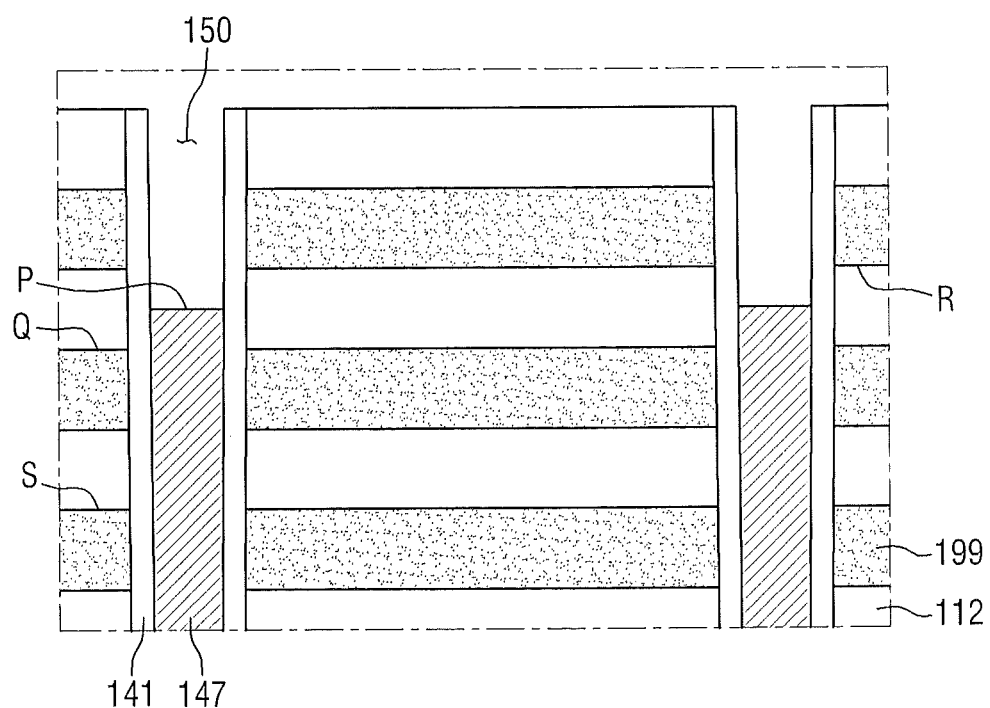
Figure 9:
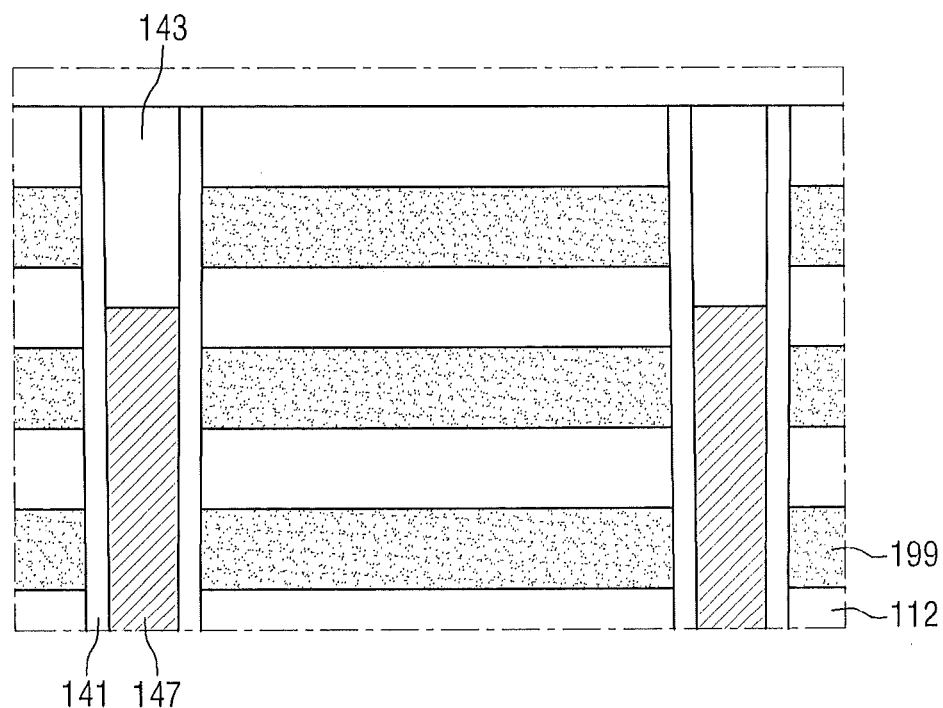

Referring to FIG. 8, an upper trench 150 is formed by removing a top portion of the first electrode 147. Here, the forming of the upper trench 150 may include etching the top portion of the first electrode 147 using at least one of phosphoric acid and nitric acid.

A bottom surface P of the thus formed upper trench 150 (that is, a top surface of the first electrode 147 may be lower than a bottom surface R of a top layer of the multi-layered first sacrificial layer 199. In addition, the bottom surface P of the upper trench 150 (that is, the top surface of the first electrode 147) may be higher than a top surface Q of a second topmost layer of the multi-layered first sacrificial layer 199. This is for the purpose of forming a transistor at either side of the topmost portion of the nonvolatile memory cell.

If two transistors connected in series are to be formed at opposite sides of the topmost portion of the nonvolatile memory cell, the bottom surface P of the upper trench 150 (that is, the top surface of the first electrode 147) may be lower than a top surface Q of a second topmost layer of the multi-layered first sacrificial layer 199, and the bottom surface P of the upper trench 150 (that is, the top surface of the first electrode 147) may be higher than a top surface S of a third top layer of the multi-layered first sacrificial layer 199. That is to say, the fabricating methods of the nonvolatile memory device according to embodiments of the present invention are not limited to those illustrated herein.

Referring back to FIG. 9, the upper trench (150 of FIG. 8) is filled with the channel layer 143. Here, if the upper trench (150 of FIG. 8) is not completely filled with the channel layer 143, a predetermined gap-fill layer (not shown), e.g., an oxide layer, may further be formed in the remaining space of the upper trench 150.

Here, the channel layer 143 may be formed of a material capable of functioning as a body of a transistor. In detail, the channel layer 143 may be, for example, a polysilicon (poly-Si) layer, but not limited thereto.

Figure 10:
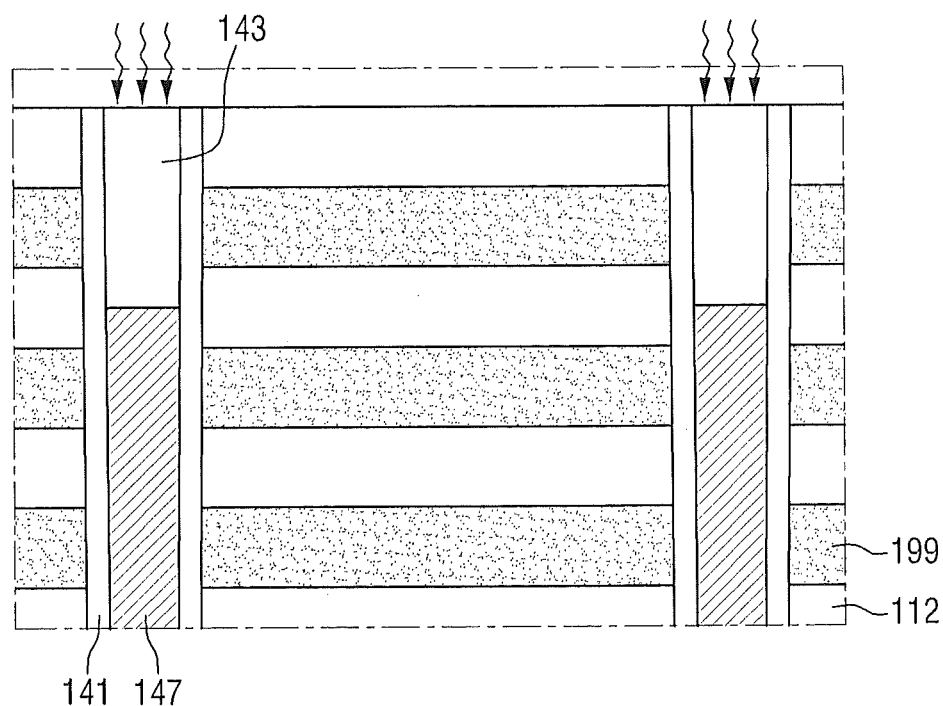

Next, referring to FIG. 10, the channel layer 143 is annealed. The annealing of the channel layer 143 is to adjust characteristics of the channel layer 143, which will later function as a body of a transistor, to be suitable for functioning as the body of the transistor.

In detail, if the channel layer 143 is a poly-Si layer, the layer characteristic may be adjusted by annealing the poly-Si layer by, for example, laser annealing or thermal annealing.

Meanwhile, the adjusting of layer characteristics of the channel layer 143 is not limited to annealing. The layer characteristics of the channel layer 143 may be adjusted by doping impurities of a first conductivity type (N type) or a second conductivity type (P type) into the channel layer 143 according to the necessity.

Figure 11:
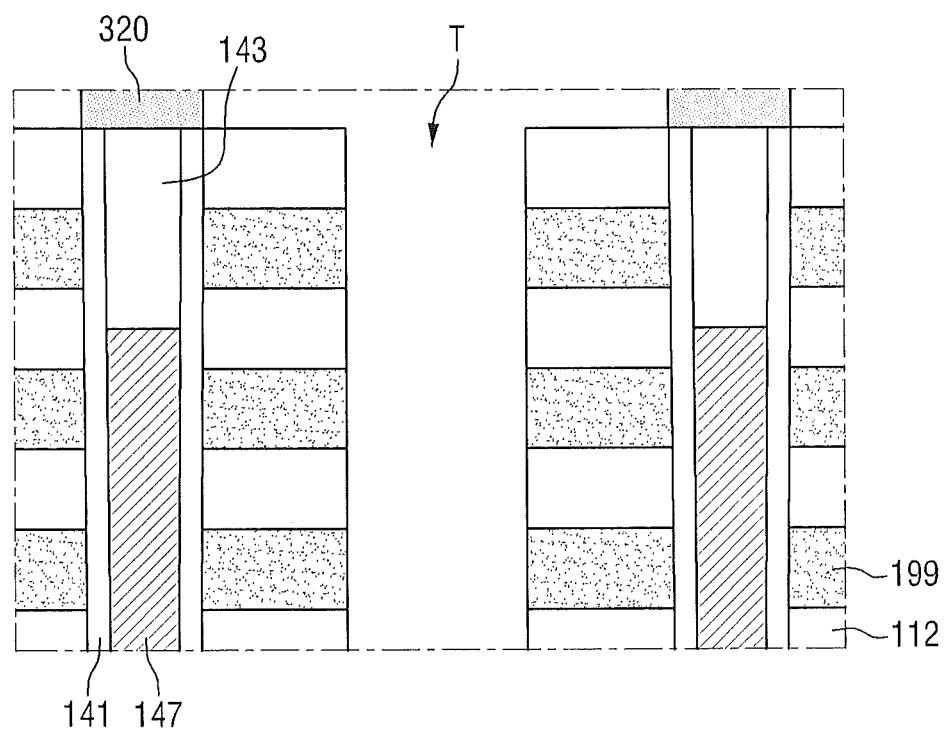

Referring to FIG. 11, a bit line contact 320 is formed on the channel layer 143. Here, the bit line contact 320 may be formed to contact the channel layer 143.

Next, an isolation trench T spaced apart from first electrodes 147 is formed by removing portions of the multi-layered first sacrificial layer 199 and the multi-layered interlayer dielectric films 112. In this case, the trench T may be disposed between adjacent first electrodes 143.

Figure 12:
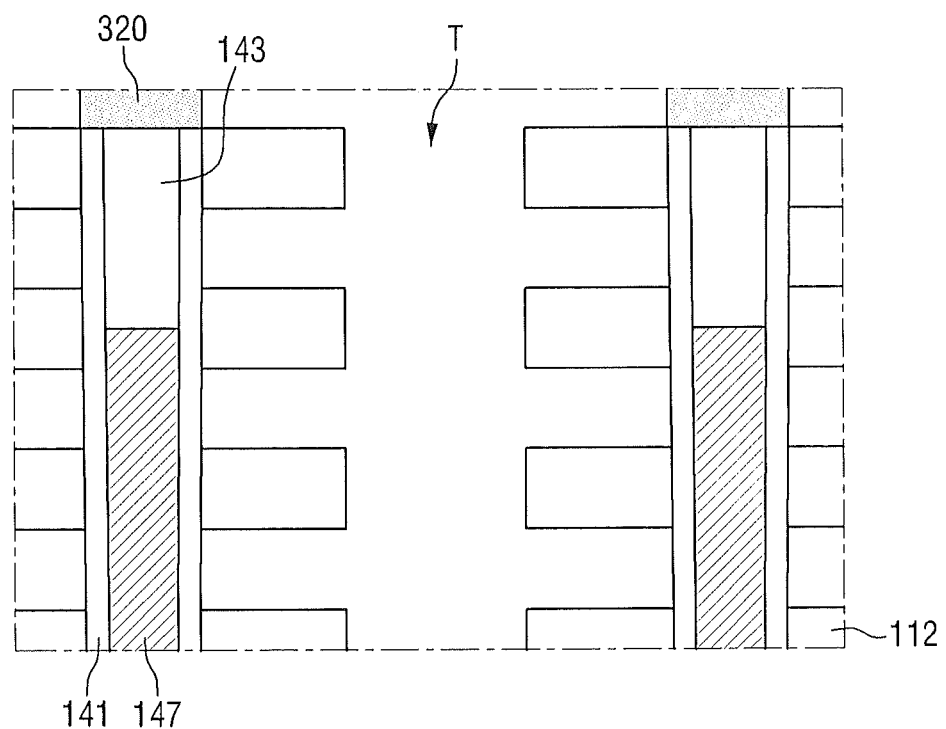

Referring to FIG. 12, portions of side surfaces of the resistance variable layers 141 are exposed by removing the multi-layered first sacrificial layer (199 of FIG. 11).

In detail, the multi-layered first sacrificial layer (199 of FIG. 11) is etched using the etching selectivity of the multi-layered first sacrificial layer (199 of FIG. 11) with respect to the multi-layered interlayer dielectric films 112 and the resistance variable layers 141. In detail, the multi-layered first sacrificial layer (199 of FIG. 11) may be removed by wet etching). Here, the process of removing the multi-layered first sacrificial layer (199 of FIG. 11) is also referred to as a pull-back process. The pull-back process may be performed using phosphoric acid, sulfuric acid, chloric acid, or mixtures, but embodiments of the present invention are not limited thereto.

Referring back to FIG. 12, portions of the side surfaces of the resistance variable layers 141 may be exposed by removing the multi-layered first sacrificial layer 199. In detail, portions of the side surfaces of the resistance variable layers 141 adjacent to the channel layer 143 may be exposed by removing the topmost first sacrificial layer (199 of FIG. 11), and portions of the side surfaces of the resistance variable layers 141 adjacent to the first electrode 147 by removing the first sacrificial layers 199 under the topmost first sacrificial layer.

Figure 13:
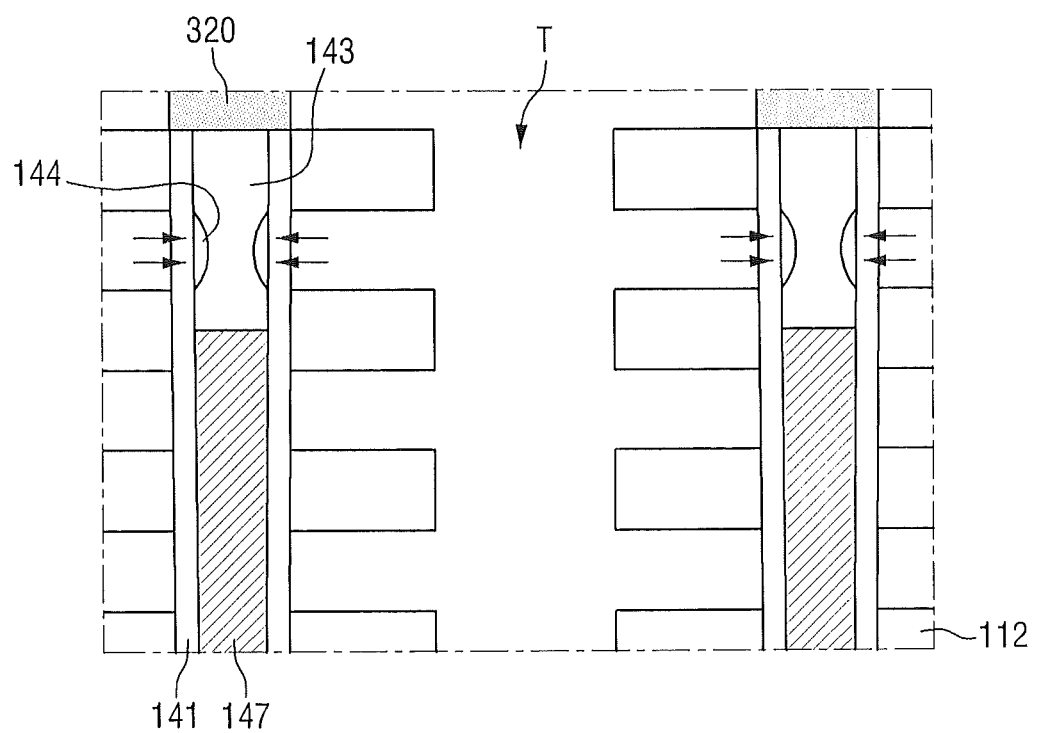

Referring to FIG. 13, an insulation layer 144 is formed in the channel layer 143. In detail, the exposed portions of the side surfaces of the resistance variable layers 141 are subjected to heat oxidation, thereby forming the insulation layer 144 formed of an oxide layer in the channel layer 143. In more detail, the side surface of the channel layer 143 made of polysilicon (poly-Si) is thermally oxidized, thereby forming the insulation layer 144 formed of an silicon oxide ($SiO_2$) layer in the channel layer 143.

Referring to FIG. 4, a plurality of second electrodes 211-291, 212-292 and 213-293 are formed on the exposed side surfaces of the resistance variable layers 141. In detail, top portions of the exposed side surfaces of the resistance variable layers 141 and the isolation trench T are filled with a conductive material, and the conductive material is etched to form the isolation trench T, thereby forming the plurality of second electrodes 211-291, 212-292 and 213-293 on the side surfaces of the exposed resistance variable layers 141. Here, the side surfaces of the plurality of second electrodes 211-291, 212-292 and 213-293 exposed by the isolation trench T and side surfaces of the plurality of interlayer dielectric films 112 may be aligned with each other.

The plurality of second electrodes 211-291, 212-292 and 213-293 may be made of, for example, a metal, and examples of the metal may include Ti/TiN, Ta/TiN, W, Pt, Pd, Rh, Ru, Ir, alloys thereof, but is not limited thereto.

Next, a nonvolatile memory device according to another embodiment of the present invention will be described with reference to FIG. 14.

Figure 14:
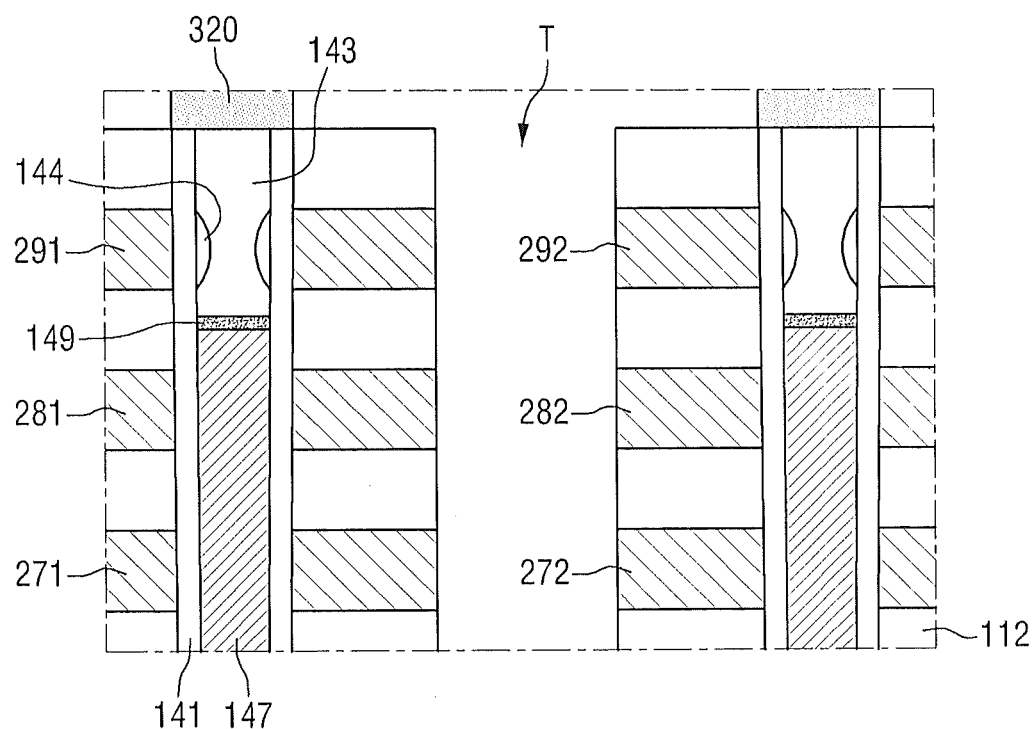
FIG. 14 is a sectional view of a nonvolatile memory device according to another embodiment of the present invention.

FIG. 14 is a sectional view of a nonvolatile memory device according to another embodiment of the present invention. The following description will focus on only differences from the previous embodiment, and the same numerals indicate the same elements.

Referring to FIG. 14, the nonvolatile memory device 2 may further include a silicide layer 149. The silicide layer 149 may be formed between the first electrodes 147 and the channel layer 149. In detail, the silicide layer 149 may be formed on a contact surface between the first electrodes 147 and the channel layer 149, which may improve contact capability therebetween.

Examples of the silicide layer 149 may include, but are not limited to, a tungsten (W) silicide layer, and a cobalt (Co) silicide layer.

The nonvolatile memory device 2 may be fabricated by various fabrication methods. An exemplary method for fabricating a nonvolatile memory device according to another embodiment of the present invention will now be described.

Figure 15:
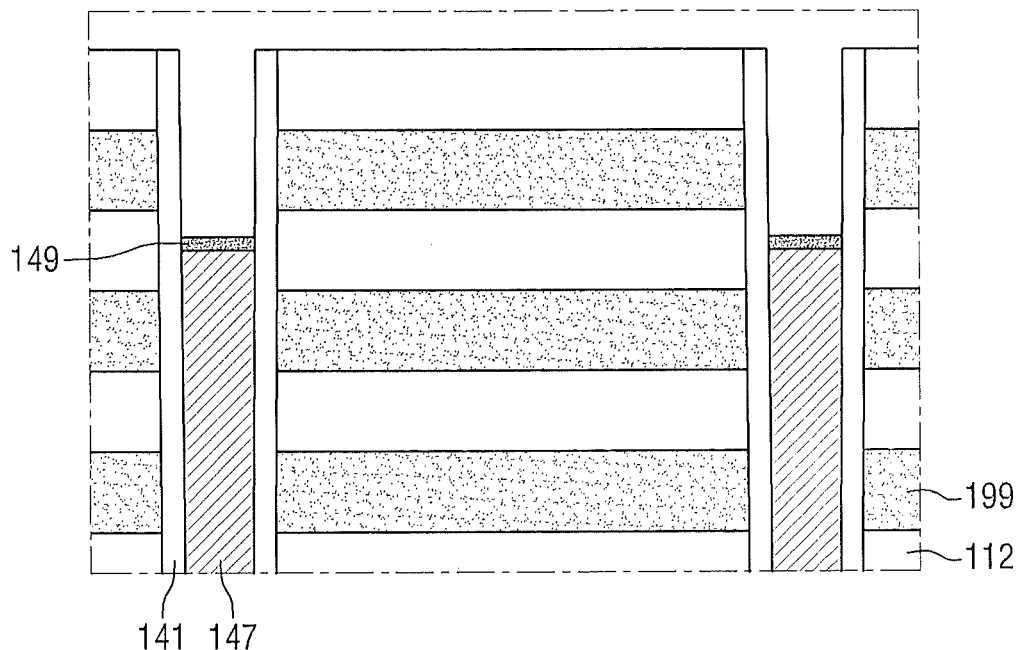
FIGS. 15 and 16 illustrate interim steps of a method for fabricating a nonvolatile memory device according to another embodiment of the present invention.
Figure 16:
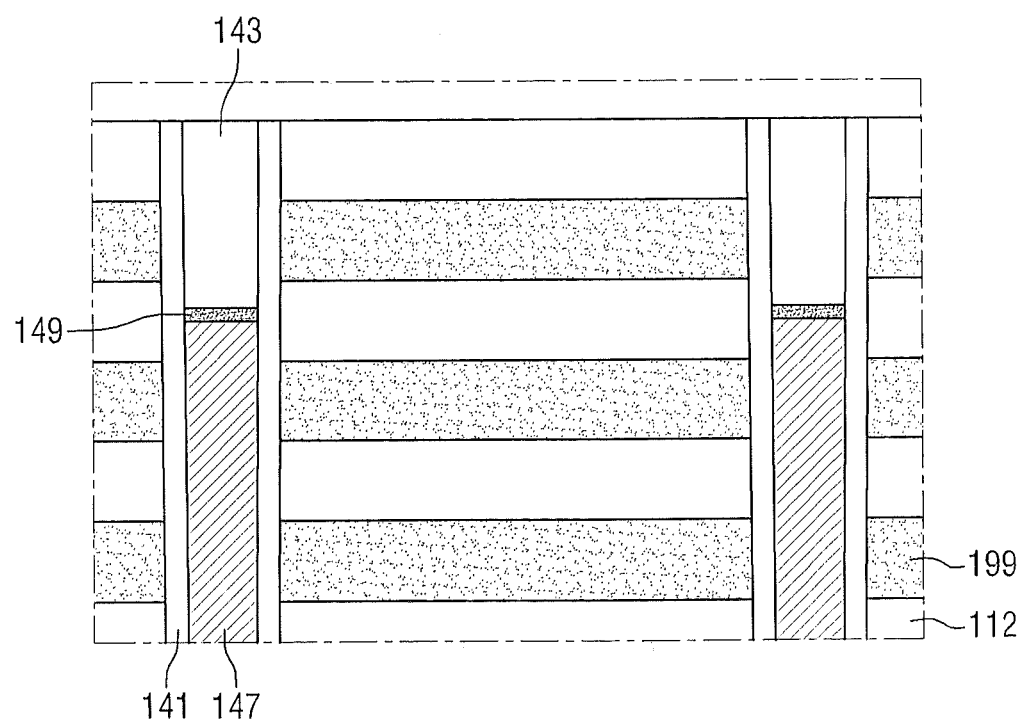

FIG. 15 and FIG. 16 illustrate interim steps of a method for fabricating a nonvolatile memory device according to another embodiment of the present invention.

First, top portions of the first electrodes 147 are removed in the same method as described with reference to FIGS. 6 to 8 to form an upper trench 150.

Referring to FIG. 15, a silicide layer 149 is formed in the upper trench (150 of FIG. 8). In detail, the silicide layer 149 formed of, for example, a tungsten (W) silicide layer, or a cobalt (Co) silicide layer, is formed on the first electrodes 147 exposed by the upper trench 150.

Referring to FIG. 16, a channel layer 143 is formed on the silicide layer 149. In such a manner, if the channel layer 143 is formed on the silicide layer 149, the contact capability between the channel layer 143 and the first electrodes 147 may be improved.

Next, the nonvolatile memory device according to the current embodiment may be fabricated in the same method as described above with reference to FIGS. 10 to 13.

A nonvolatile memory device according to still another embodiment of the present invention will now be described with reference to FIGS. 17 and 18.

Figure 17:
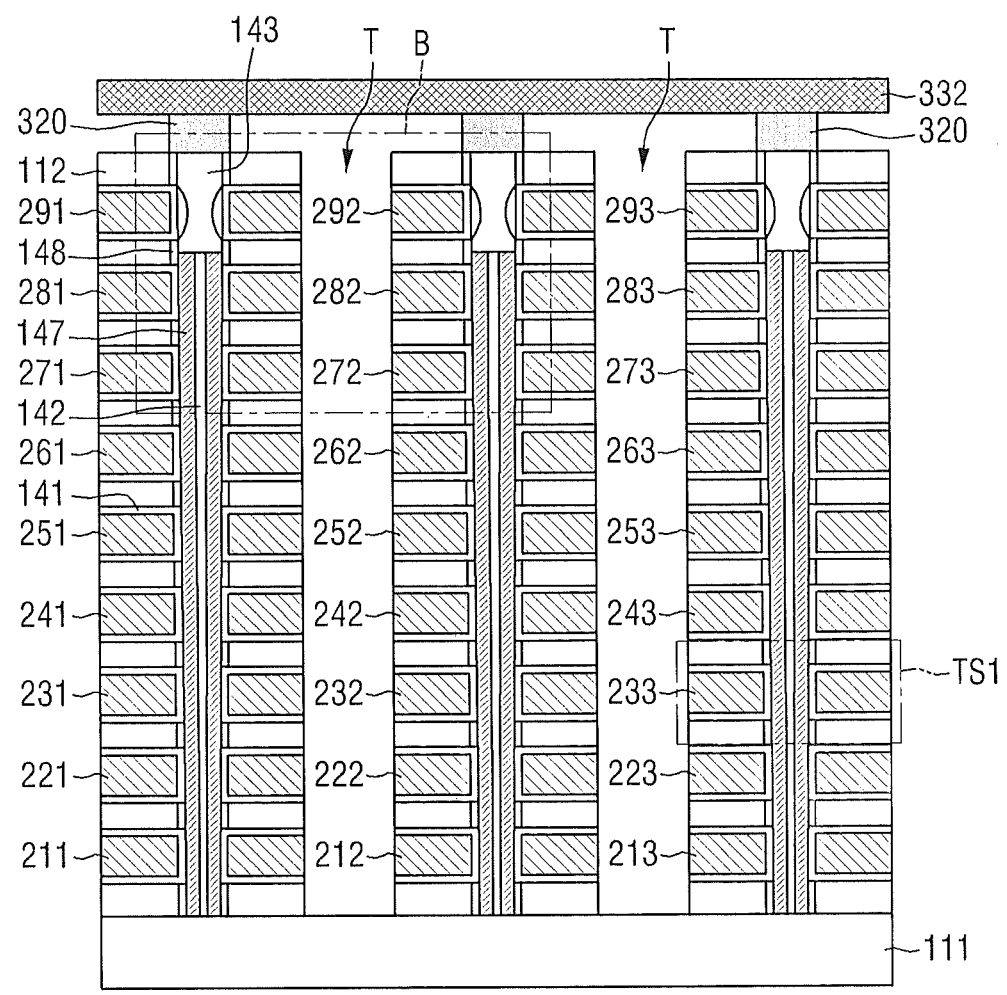
FIG. 17 is a sectional view of a nonvolatile memory device according to still another embodiment of the present invention.
Figure 18:
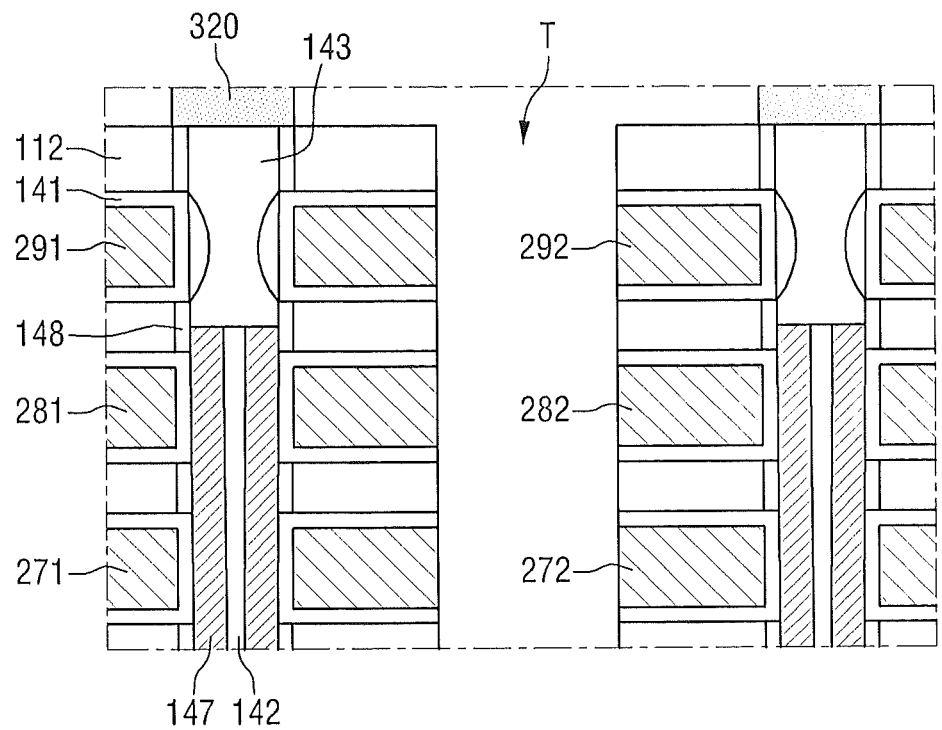
FIG. 18 is an enlarged view illustrating a 'B' region of FIG. 17.

FIG. 17 is a sectional view of a nonvolatile memory device according to still another embodiment of the present invention, and FIG. 18 is an enlarged view illustrating a 'B' region of FIG. 17. The following description will focus on only differences from the previous embodiment, and the same numerals indicate the same elements.

Referring to FIGS. 17 and 18, in the nonvolatile memory device 3 according to still another embodiment of the present invention, resistance variable layers 141 may be formed on top surfaces of interlayer dielectric films 112 positioned under a plurality of second electrodes 211-291, 212-292 and 213-293, side surfaces of a channel layer 143 or first electrodes 147, and bottom surfaces of the interlayer dielectric films 112 positioned on the plurality of second electrodes 211-291, 212-292 and 213-293. That is to say, the resistance variable layers 141 are formed to surround the plurality of second electrodes 211-291, 212-292 and 213-293.

Meanwhile, a second sacrificial layer (e.g., a silicon oxide ($SiO_2$) layer) 148 is formed between the first electrodes 147 and the interlayer dielectric films 112. However, the second sacrificial layer 148 may not be formed when necessary.

In addition, a nitride layer (e.g., a silicon nitride (SiNx) layer) 142 is formed in the first electrodes 147. That is to say, the first electrodes 147 may be formed to surround the nitride layer (e.g., a silicon nitride (SiNx) layer) 142. However, the nitride layer (e.g., a silicon nitride (SiNx) layer) 142 may not be formed, either, when necessary.

The same elements as those of the previous embodiment will not be repeated and a detailed description will not be given.

The nonvolatile memory device 2 may be fabricated by various fabrication methods. An exemplary method for fabricating a nonvolatile memory device according to still another embodiment of the present invention will now be described.

FIGS. 19 to 24 illustrate interim steps of a method for fabricating a nonvolatile memory device according to still another embodiment of the present invention.

Referring to FIG. 6, multi-layered interlayer dielectric films 112 and multi-layered first sacrificial layers 199 are alternately stacked on a semiconductor substrate 111.

Figure 19:
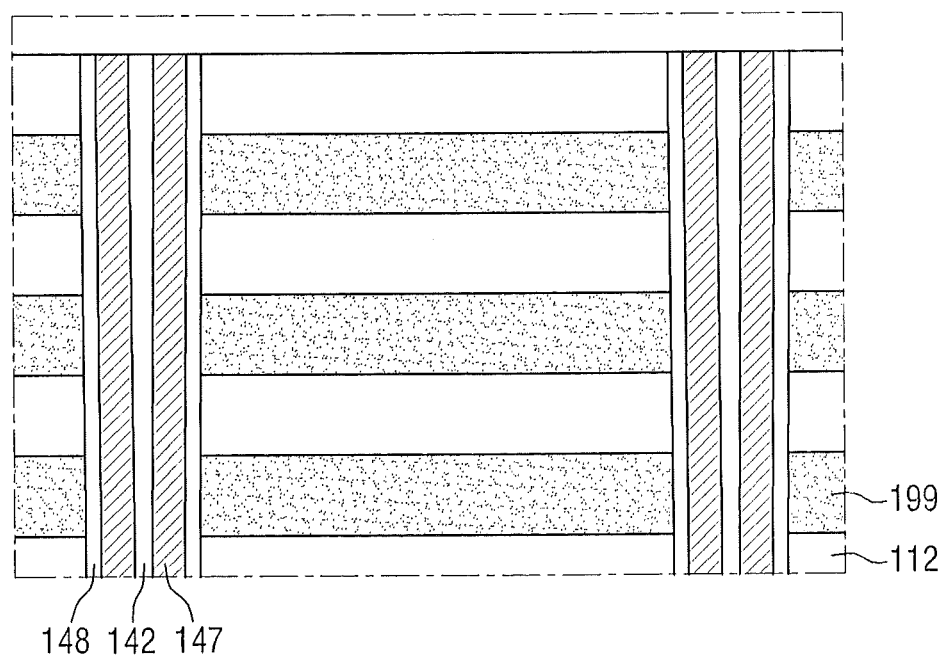
FIGS. 19 to 24 illustrate interim steps of a method for fabricating a nonvolatile memory device according to still another embodiment of the present invention.

Referring to FIG. 19, second sacrificial layers 148, first electrodes 147 and nitride layers 142, which penetrate the multi-layered interlayer dielectric films 112 and the multi-layered first sacrificial layers 199, are formed. In detail, the multi-layered interlayer dielectric films 112 and the multi-layered first sacrificial layers 199 are etched to form penetration holes. The second sacrificial layers 148, the first electrodes 147 and the nitride layers 142 are sequentially formed within the penetration holes.

Figure 20:
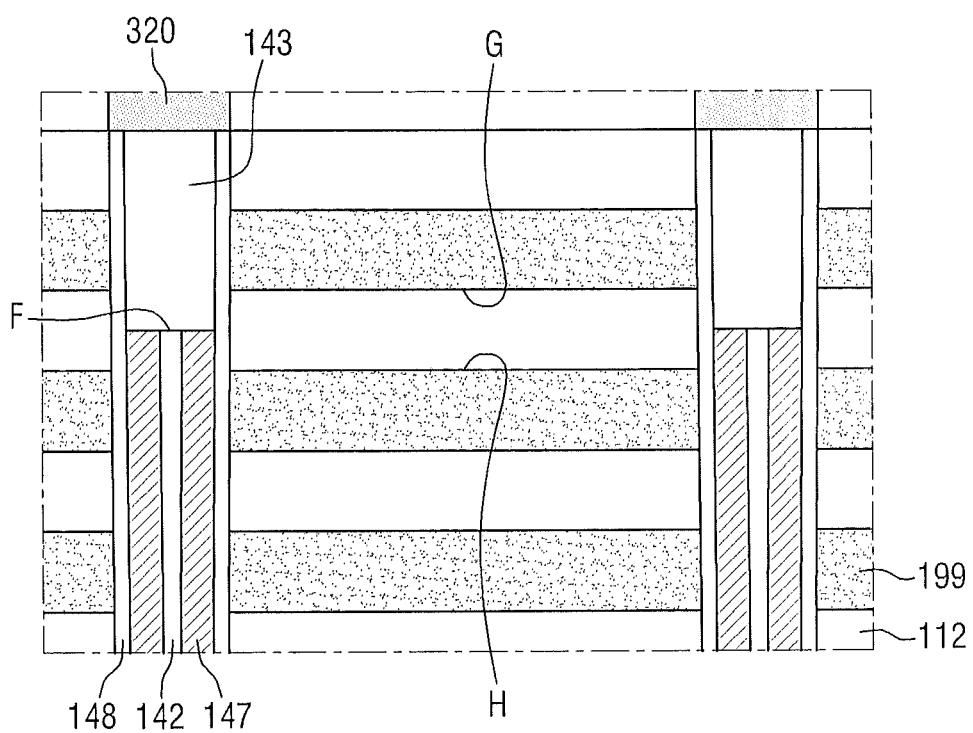

Referring to FIG. 20, top portions of the first electrodes 147 and the nitride layers 142 are removed to form upper trenches. Here, a top surface F of the first electrode 147 and the nitride layer 142 may be lower than a bottom surface G of the topmost first sacrificial layer 199. In addition, the top surface F of the first electrode 147 and the nitride layer 142 may be higher than a top surface H of the second topmost first sacrificial layer 199.

Next, a channel layer 143 is formed on the first electrodes 147 and the nitride layers 142. Then, annealing is performed to adjust characteristics of the channel layer 143. Next, a bit line contact 320 contacting the channel layer 143 is formed on the channel layer 143.

Figure 21:
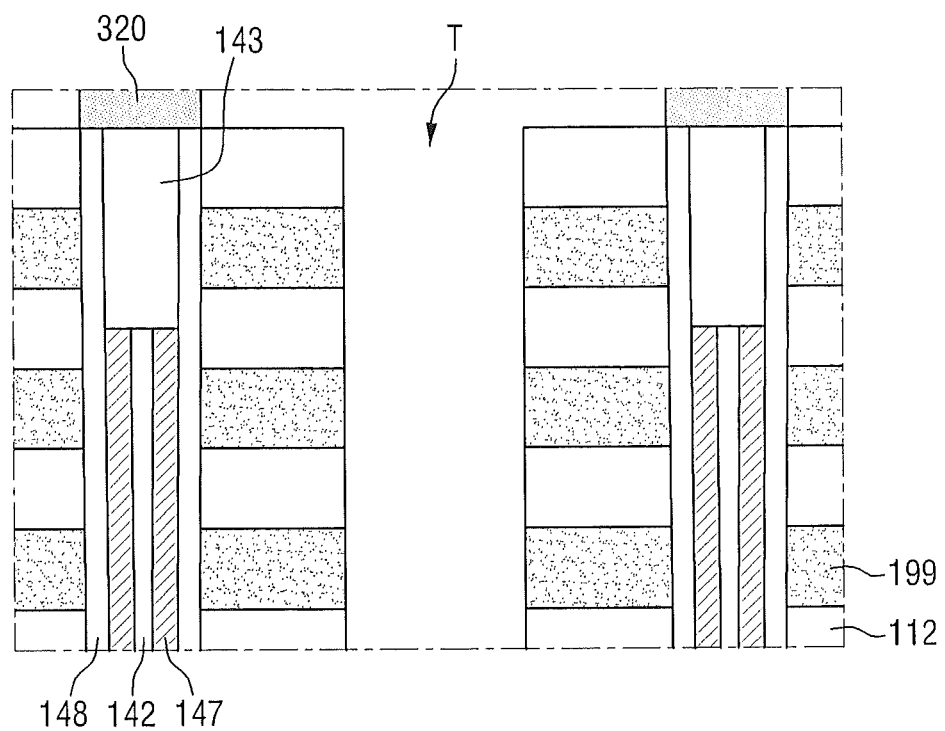

Referring to FIG. 21, an isolation trench T spaced apart from the first electrodes 147 is formed by partially removing the multi-layered first sacrificial layers 199 and the multi-layered interlayer dielectric films 112. In this case, the isolation trench T may be disposed between adjacent ones of the first electrodes 147.

Figure 22:
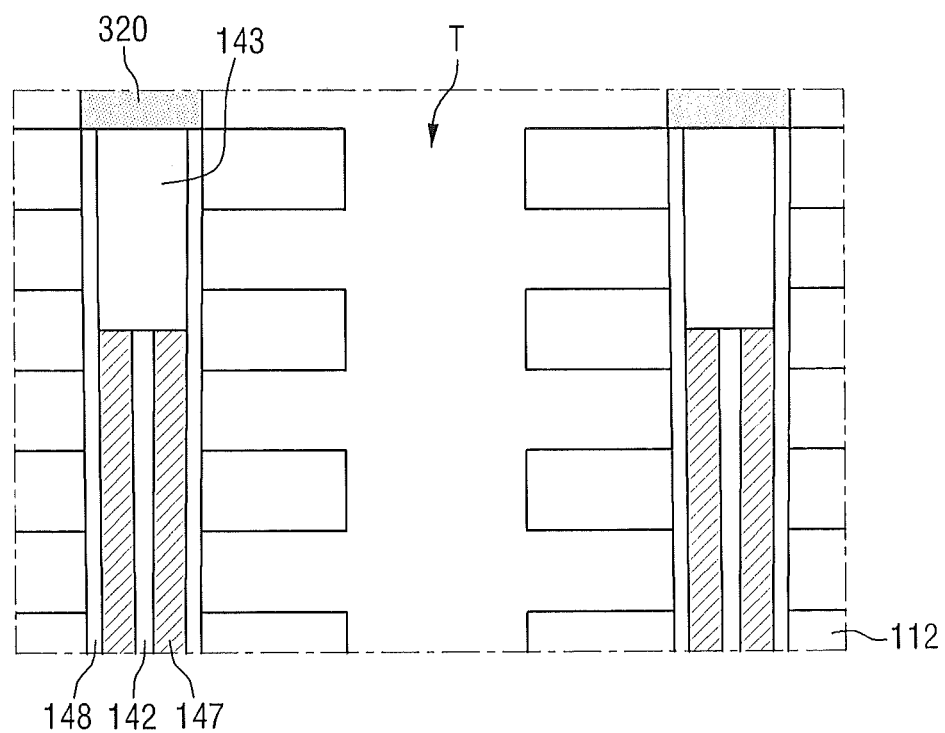

Referring to FIG. 22, a portion of the side surface of the channel layer 143 and portions of the side surfaces of the resistance variable layers 141 are exposed by removing the multi-layered first sacrificial layers (199 of FIG. 21). Here, portions of the second sacrificial layers 148 may also be removed with the multi-layered first sacrificial layers 199, thereby exposing the portion of the side surface of the channel layer 143 and the portions of the side surfaces of the resistance variable layers 141.

The removing process may include primary removing the multi-layered first sacrificial layers 199 formed of, for example, nitride layers, by wet etching using a phosphoric acid solution, and secondary removing the second sacrificial layers 148 formed of, for example, oxide layers, by wet etching using HF.

Figure 23:
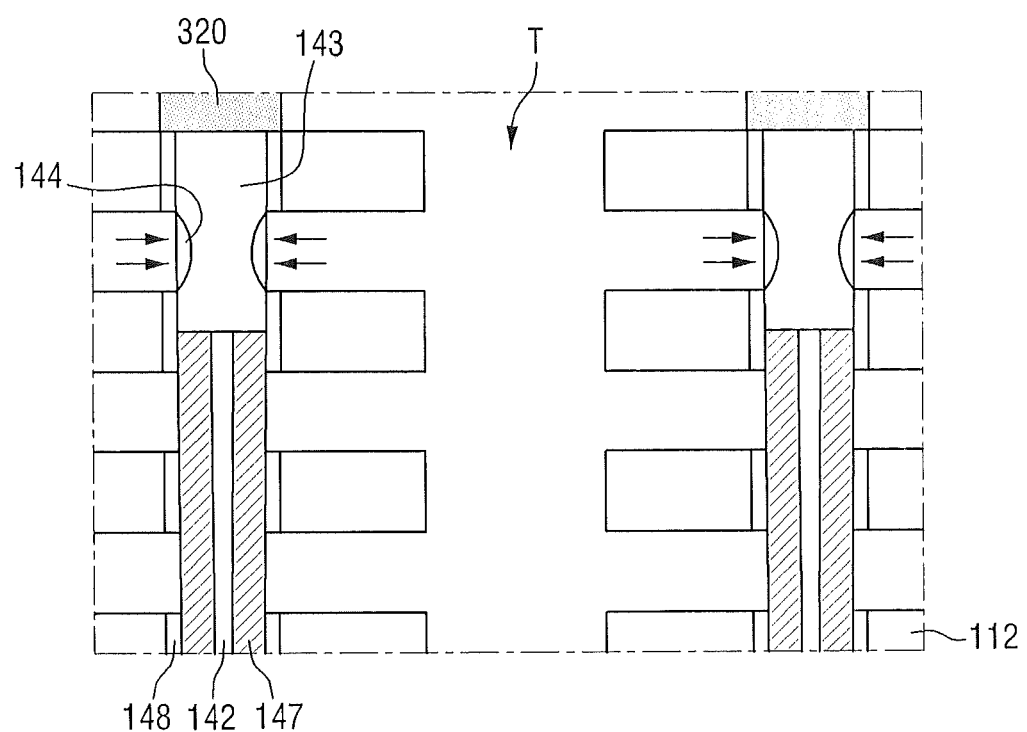

Referring to FIG. 23, an insulation layer 144 is formed in the side surface of the exposed channel layer 143. In detail, the side surface of the exposed channel layer 143 is thermally oxidized, thereby forming the insulation layer 144 formed of an oxide layer in the channel layer 143.

Figure 24:
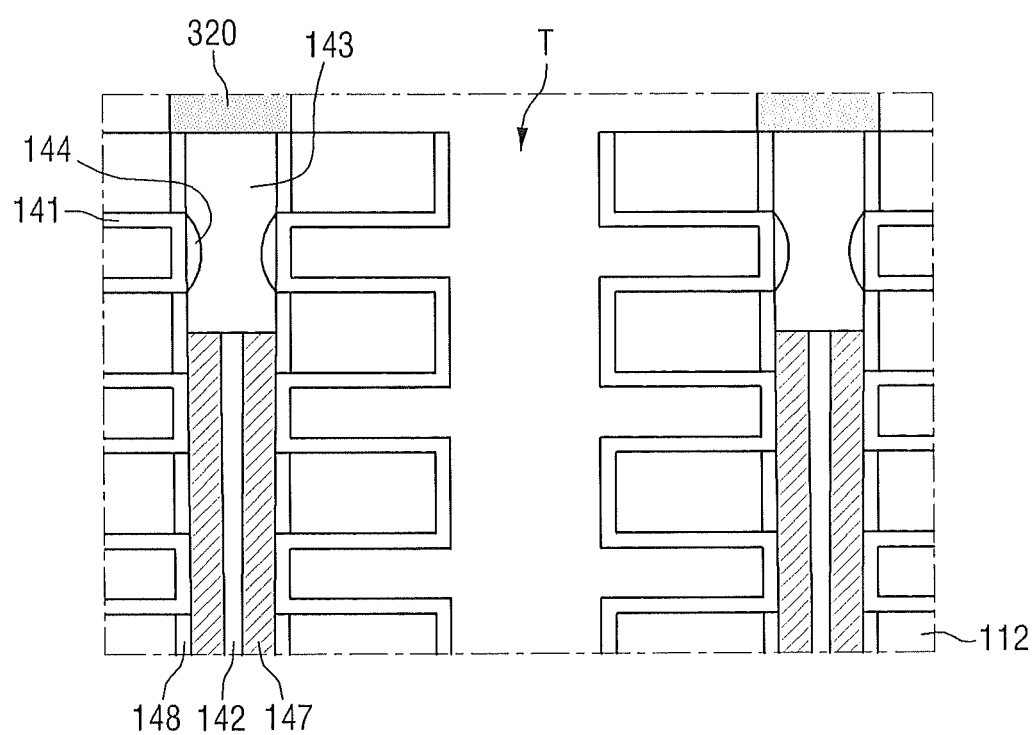

Referring to FIG. 24, resistance variable layers 141 are formed on top surfaces of the underlying interlayer dielectric films 112 in spaces resulting from the removing of the multi-layered first sacrificial layers 199, side surfaces of the exposed channel layer 143 or the first electrodes 147, and bottom surfaces of the overlying interlayer dielectric films 112. Here, resistance variable layers 141 may contact remaining portions of the second sacrificial layers 148, which are not removed by the etching.

Referring to FIG. 18, a plurality of second electrodes 211-291, 212-292 and 213-293 are formed on the resistance variable layers 141. In detail, top portions of the resistance variable layers 141 and the isolation trench T are filled with a conductive material, and the conductive material is etched to form again the isolation trench T, thereby forming the plurality of second electrodes 211-291, 212-292 and 213-293 on the resistance variable layers 141. In the course of forming again the isolation trench T, the resistance variable layers 141 formed on the side surfaces of the plurality of interlayer dielectric films 112 may be removed.

Next, a memory system according to embodiments of the present invention and application examples thereof will be described with reference to FIGS. 25 to 27.

Figure 25:
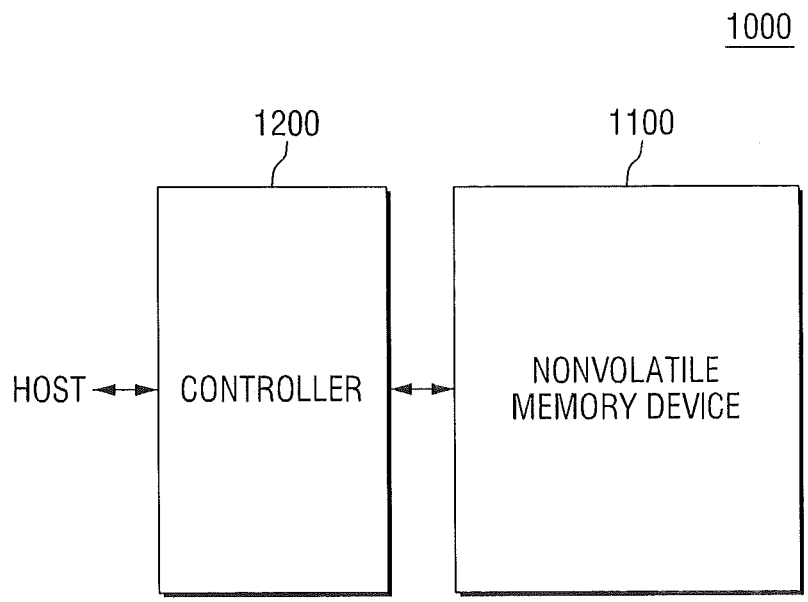
FIG. 25 is a block diagram of a memory system according to embodiments of the present invention.
Figure 26:
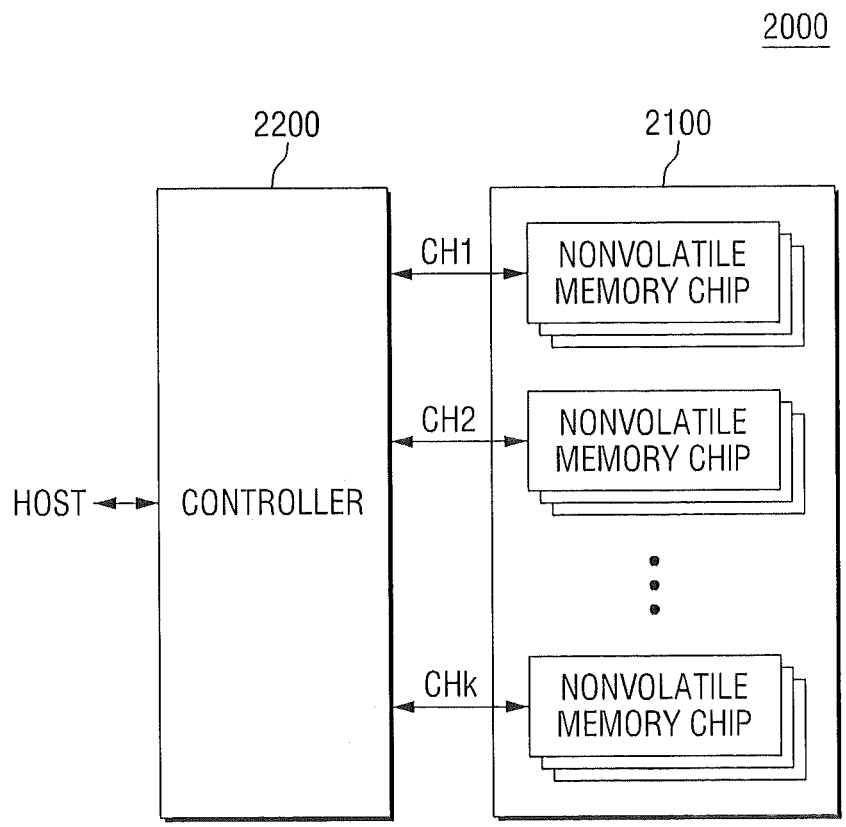
FIG. 26 is a block diagram illustrating application examples of the memory system shown in FIG. 25.
Figure 27:
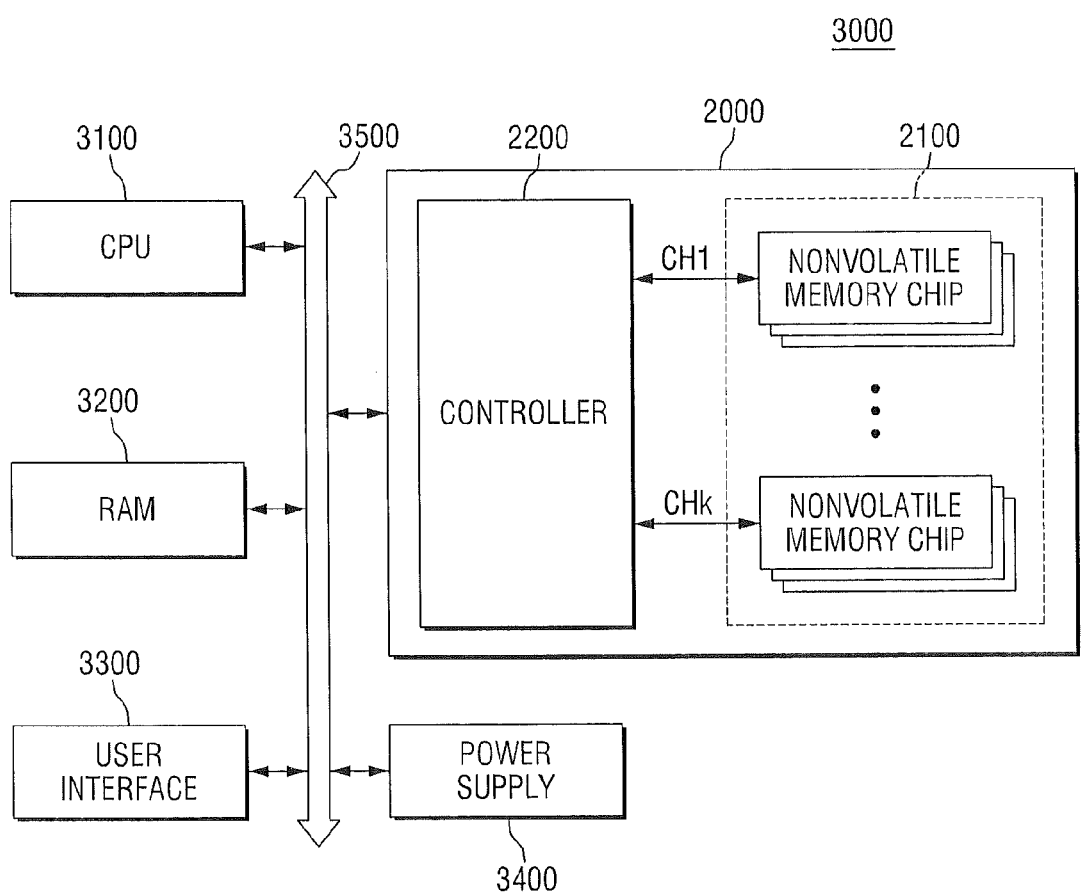
FIG. 27 is a block diagram of a computing system including the memory system shown in FIG. 26.

FIG. 25 is a block diagram of a memory system according to embodiments of the present invention, FIG. 26 is a block diagram illustrating application examples of the memory system shown in FIG. 25, and FIG. 27 is a block diagram of a computing system including the memory system shown in FIG. 26.

Referring to FIG. 25, the memory system 1000 includes a nonvolatile memory device 1100 and a controller 1200.

Here, the nonvolatile memory device 1100 may be a vertically stacked nonvolatile memory device including transistors for controlling the memory cell in a predetermined unit (for example, in units of pages or sections).

The controller 1200 is connected to a host and the nonvolatile memory device 1100. The controller 1200 is configured to access the nonvolatile memory device 1100 in response to a request from the host. For example, the controller 1200 may be configured to control read/write/erase/background operations of the nonvolatile memory device 1100. As another example, the controller 1200 may be configured to provide an interface between the nonvolatile memory device 1100 and the host. As another example, the controller 1200 may be configured to drive firmware for controlling the nonvolatile memory device 1100.

In an exemplary embodiment, the controller 1200 may include conventional components such as a RAM, a processing unit, a host interface, and a memory interface. The RAM may be used as an operational memory of the processing unit. The processing unit may control general operations of the controller 1200.

The host interface may include a protocol for data exchange between the host and the controller 1200. For example, the controller 1200 may be configured to communicate with the outside (e.g., the host) through one of various interface protocols such as USB, MMC, PCI-E, ATA (Advance Technology Attachment), Serial-ATA, Parallel-ATA, SCSI, ESDI, and IDE (Integrated Drive Electronics). The memory interface may interface with the nonvolatile memory device 1100. For example, the memory interface may include a NAND interface or a NOR interface.

The memory system 1000 may be configured to further include an error correction code (ECC) block, which may detect and correct an error in data read from the nonvolatile memory device 1100. For example, the ECC block may be provided as a component of the controller 1200. Alternatively, the ECC block may be provided as a component of the nonvolatile memory device 1100.

The controller 1200 and the nonvolatile memory device 1100 may be integrated into one semiconductor device. In an exemplary embodiment, the controller 1200 and the nonvolatile memory device 1100 are integrated into one semiconductor device to constitute a memory card such as, for example, a PC card (PCMCIA), a compact flash card (CF), a smart media card (SM/SMC), a memory stick, a multimedia card (MMC, RS-MMC, MMCmicro), an SD card (SD, miniSD, and microSD), a universal flash storage (UFS), and the like.

In another exemplary embodiment, the controller 1200 and the nonvolatile memory device 1100 are integrated into one semiconductor device to constitute a solid-state disk/drive (SSD). In this case the memory system 10 may be used as an SSD which exhibits an enhanced operation speed in communication with the host.

As another example, the memory system 1000 may be applicable to computers, UMPCs (Ultra Mobile PCs), workstations, net-books, PDAs, portable computers, web tablets, wireless phones, mobile phones, smart phones, e-books, portable multimedia players, portable game devices, navigation devices, black boxes, digital cameras, 3-dimensional televisions, digital audio recorders, digital audio players, digital picture recorders, digital picture players, digital video recorders, digital video players, devices capable of transmitting/receiving information in wireless environments, one of various electronic devices constituting a home network, one of various electronic devices constituting a computer network, one of various electronic devices constituting a telematics network, RFID devices, or one of various components constituting a computing system.

As another example, the memory device 1100 or the memory system 1000 may be mounted in various types of packages. Examples of packages that may include the memory device 1100 or the memory system 1000 include Package on Package (PoP), Ball Grid Arrays (BGA), Chip Scale Packages (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

Referring to FIG. 26, the memory system 2000 includes a nonvolatile memory device 2100 and a controller 2200. The nonvolatile memory device 2100 includes a plurality of nonvolatile memory chips. The plurality of nonvolatile memory chips may be divided into a plurality of groups. The respective groups of the plurality of nonvolatile memory chips are configured to communicate with the controller 2200 through common channels. For example, the plurality of nonvolatile memory chips communicate with the controller 2200 through first to kth channels CH1~CHk.

While FIG. 26 illustrates that a plurality of nonvolatile memory chips are connected to one channel, it will be appreciated that the memory system 2000 may be modified such that one nonvolatile memory chip is connected to one channel.

Referring to FIG. 27, the computing system 3000 includes a central processing unit (CPU) 3100, a random access memory (RAM) 3200, a user interface 3300, a power supply 3400, and a memory system 2000.

The memory system 2000 is electrically connected to the CPU 3100, the RAM 3200, the user interface 3300, and the power supply 3400 through a system bus 3500. Data supplied through the user interface 3300 or processed by the CPU 3100 may be stored in the memory system 2000.

While FIG. 27 illustrates that the nonvolatile memory device 2100 is connected to the system bus 3500 through the controller 2200, the nonvolatile memory device 2100 may be directly connected to the system bus 3500.

While FIG. 27 illustrates that the nonvolatile memory device 2100 is provided with the memory system 2000 shown in FIG. 26, the memory system 2000 may be replaced by the memory system 1000 shown in FIG. 25.

As an example, the computing system 3000 may be configured to include both of the memory systems 1000 and 2000 shown in FIGS. 25 and 26.

While the present invention has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. A method for fabricating a nonvolatile memory device, the method comprising:
sequentially stacking on a semiconductor substrate a first interlayer dielectric film, a first sacrificial layer, a second interlayer dielectric film, and a second sacrificial layer;
forming a resistance variable layer and a first electrode penetrating the first and second interlayer dielectric films and the first and second sacrificial layers;
forming an upper trench by removing a top portion of the first electrode;
filling the upper trench with a channel layer;
exposing a portion of a side surface of the resistance variable layer by removing the second sacrificial layer;
forming an insulation layer within the channel layer; and
forming a second electrode on the exposed resistance variable layer.

2. The method of claim 1, wherein the forming of the upper trench comprises etching the top portion of the first electrode using at least one of phosphoric acid and nitric acid.

3. The method of claim 2, wherein a bottom surface of the upper trench is lower than a bottom surface of the second sacrificial layer.

4. The method of claim 3, wherein a bottom surface of the upper trench is higher than a top surface of the first sacrificial layer.

5. The method of claim 1, wherein the channel layer includes a polysilicon layer.

6. The method of claim 5, further comprising annealing the polysilicon layer.

7. The method of claim 6, wherein the annealing includes laser annealing or thermal annealing.

8. The method of claim 5, further comprising doping impurity into the polysilicon layer.

9. The method of claim 1, wherein the insulation layer includes an oxide layer.

10. The method of claim 9, wherein the oxide layer is formed by performing heat oxidation on a portion of a side surface of the channel layer.

11. The method of claim 1, further comprising a silicide layer on the upper trench, wherein the channel layer is formed on the silicide layer.

12. The method of claim 11, wherein the silicide layer includes a tungsten (W) silicide layer, and a cobalt (Co) silicide layer.

13. The method of claim 1, wherein the resistance variable layer is a transition metal oxide.

14. A method for fabricating a nonvolatile memory device, the method comprising:
sequentially stacking on a semiconductor substrate a first interlayer dielectric film, a first sacrificial layer, a second interlayer dielectric film, and a second sacrificial layer;
forming a first electrode penetrating the first and second interlayer dielectric films and the first and second sacrificial layers;
forming an upper trench by removing a top portion of the first electrode;
filling the upper trench with a channel layer;
exposing a portion of a side surface of the channel layer by removing the second sacrificial layer;
forming an insulation layer within the side surface of the exposed channel layer;
forming a resistance variable layer along a top surface of the second interlayer dielectric film and a side surface of the exposed channel layer; and
forming a second electrode on the resistance variable layer.

15. The method of claim 14, further comprising:
exposing a portion of the side surface of the first electrode by removing the first sacrificial layer; and
forming a resistance variable layer along a top surface of the first interlayer dielectric film, a side surface of the exposed first electrode and a bottom surface of the second interlayer dielectric film.

* * * * *